(12) United States Patent
Fu et al.

(10) Patent No.: US 8,804,100 B2
(45) Date of Patent: Aug. 12, 2014

(54) METHOD AND SYSTEM FOR CALIBRATING EXPOSURE SYSTEM FOR MANUFACTURING OF INTEGRATED CIRCUITS

(75) Inventors: Jiunhau Fu, Shanghai (CN); Cher Huan Tan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 143 days.

(21) Appl. No.: 12/398,143

(22) Filed: Mar. 4, 2009
(Under 37 CFR 1.47)

(65) Prior Publication Data
US 2010/0316958 A1    Dec. 16, 2010

(30) Foreign Application Priority Data

Jul. 15, 2008    (CN) .......................... 2008 1 0040571

(51) Int. Cl.
     *G03B 27/32*      (2006.01)
     *G03B 27/52*      (2006.01)

(52) U.S. Cl.
     USPC .............................................. 355/77; 355/55

(58) Field of Classification Search
     CPC ................................................. G03F 7/70641
     See application file for complete search history.

(56) References Cited

U.S. PATENT DOCUMENTS

| | | | |
|---|---|---|---|
| 5,300,756 A | | 4/1994 | Cordingley |
| 5,300,786 A | * | 4/1994 | Brunner et al. ............... 250/548 |
| 6,376,139 B1 | * | 4/2002 | Fujisawa et al. ............... 430/30 |
| 6,573,015 B2 | * | 6/2003 | Fujimoto ........................ 430/30 |
| 2006/0103825 A1 | * | 5/2006 | Kondo ............................ 355/55 |
| 2006/0141375 A1 | * | 6/2006 | Hauschild et al. ............. 430/30 |

* cited by examiner

*Primary Examiner* — Peter B Kim
*Assistant Examiner* — Michelle Iacoletti
(74) *Attorney, Agent, or Firm* — Kilpatrick Townsend & Stockton LLP

(57) ABSTRACT

Method and system for calibrating exposure system for manufacturing of integrated circuits. According to an embodiment, the present invention provides a method for determining one or more focus parameters for an exposure system. As an example, the exposure system is used for forming patterns on semiconductor wafer. The method includes a step for providing a semiconductor wafer. The semiconductor wafer is characterized by a diameter. The method also includes a step for forming a plurality of patterns using the exposure system on the semiconductor wafer. As an example, each of the plurality of patterns being associated with a focus reference value (e.g., focus distance, focus angle, etc.). The method additionally includes a step for determining a plurality of shift profiles, and each of the shift profile is associated one of the plurality of patterns.

5 Claims, 6 Drawing Sheets

Signal ΔX shift and OVL bar profile variation

METHOD AND SYSTEM FOR CALIBRATING EXPOSURE SYSTEM FOR MANUFACTURING OF INTEGRATED CIRCUITS

CROSS-REFERENCES TO RELATED APPLICATIONS

This application claims priority to Chinese Patent No. 200810040571.2, filed Jul. 15, 2007, commonly assigned and hereby incorporated by reference for all purposes.

BACKGROUND OF THE INVENTION

The present invention is directed to integrated circuits and their processing for the manufacture of semiconductor devices. More particularly, the invention provides a method and device for the calibrating exposure system for manufacturing of integrated circuits. Merely by way of example, the invention has been applied to the determining optimal focusing for exposure machines. But it would be recognized that the invention has a much broader range of applicability. For example, the invention can be used to form patterns on semiconductor wafers.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, inter alia, wafer growth, photolithography, doping, oxidation, deposition, etching Removal, and epitaxial Growth.

Generally, photolithography process is used to define and shape specific areas of the wafer to suit particular design of integrated circuit. Usually, a layout design used to create an optical mask (or reticle pattern, depending on application). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various processes are finished, photoresist materials are then removed.

To define patterns on a semiconductor wafer, exposure machines are commonly used in photolithography processes. Usually, it is crucial for exposure machines to be properly focused. In the past, various conventional techniques have been employed for calibrating focus of exposure machines. Unfortunately, conventional techniques are often inadequate.

Therefore, an improved method and system for calibrating exposure system is desired.

BRIEF SUMMARY OF THE INVENTION

The present invention is directed to integrated circuits and their processing for the manufacture of semiconductor devices. More particularly, the invention provides a method and device for the calibrating exposure system for manufacturing of integrated circuits. Merely by way of example, the invention has been applied to the determining optimal focusing for exposure machines. But it would be recognized that the invention has a much broader range of applicability. For example, the invention can be used to form patterns on semiconductor wafers.

According to an embodiment, the present invention provides a method for determining one or more focus parameters for an exposure system. As an example, the exposure system is used for forming patterns on semiconductor wafer. The method includes a step for providing a semiconductor wafer. The semiconductor wafer is characterized by a diameter. The method also includes a step for forming a plurality of patterns using the exposure system on the semiconductor wafer. As an example, each of the plurality of patterns is associated with a focus reference value (e.g., focus distance, focus angle, etc.). The method additionally includes a step for determining a plurality of shift profiles, and each of the shift profile is associated with one of the plurality of patterns. The method further includes a step for selecting a first pattern from the plurality of patterns based on the plurality of shift profiles. Also, the method includes a step for determining a focus parameter for the exposure system based on the first pattern.

According to another embodiment, the present invention provides a method for determining one or more focus parameters for an exposure system, which is used for forming patterns on semiconductor patterns. The method includes a step for providing a semiconductor wafer that is characterized by a diameter. The method also includes a step for defining a plurality of regions on the semiconductor wafer. As an example, each of the plurality of regions is associated with a predefined focus parameter. The method also includes a step for forming a plurality of patterns using the exposure system on the semiconductor wafer. For example, each of the plurality of patterns is positioned within one of the plurality of regions. The method further includes a step for determining a plurality of pattern positions, and each of the pattern positions is associated with one of the plurality of patterns. Also, the method includes a step for determining one or more focus parameters for the exposure system based on the plurality of pattern positions.

According yet another embodiment, the present invention provides a method for determining one or more focus parameters for an exposure system. As an example, the exposure system is used in photolithographic processes in manufacturing integrated circuits. The method includes a step for providing a semiconductor wafer, which is characterized by a diameter. The method also includes a step for forming a plurality of patterns using the exposure system on the semiconductor wafer, and each of the plurality of patterns is associated with one or more known focus parameters. The method additionally includes a step for obtaining characteristics for each of the plurality of patterns using an optical measuring device. Among other things, the characteristics include measured center positions. The method also includes a step for determining one or more focus parameters for the exposure system based on the characteristics.

It is to be appreciated that embodiments of the present invention provide various advantages over conventional techniques. Among other things, certain embodiments of the present invention greatly reduce the amount of time necessary for calibrating an exposure system. For example, conventional calibration techniques often take hours to complete. In contrast, various embodiments of the present invention reliably complete calibration of an exposure system in minutes, thereby reducing the amount of down time that is necessary for most calibration techniques. Additionally, the present invention provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for the calibrating exposure system for manufacturing of integrated circuits. Merely by way of example, the invention has been applied to the determining optimal focusing for exposure machines. But it would be recognized that the invention has a much broader range of applicability. For example, the invention can be used to form patterns on semiconductor wafers.

As explained above, it is often crucial to properly calibrate exposure systems that are used in photolithography processes. For example, it is crucial to select an optimal focus distance for exposure system daily to ensure the accuracy of photography processes.

Figure 1:
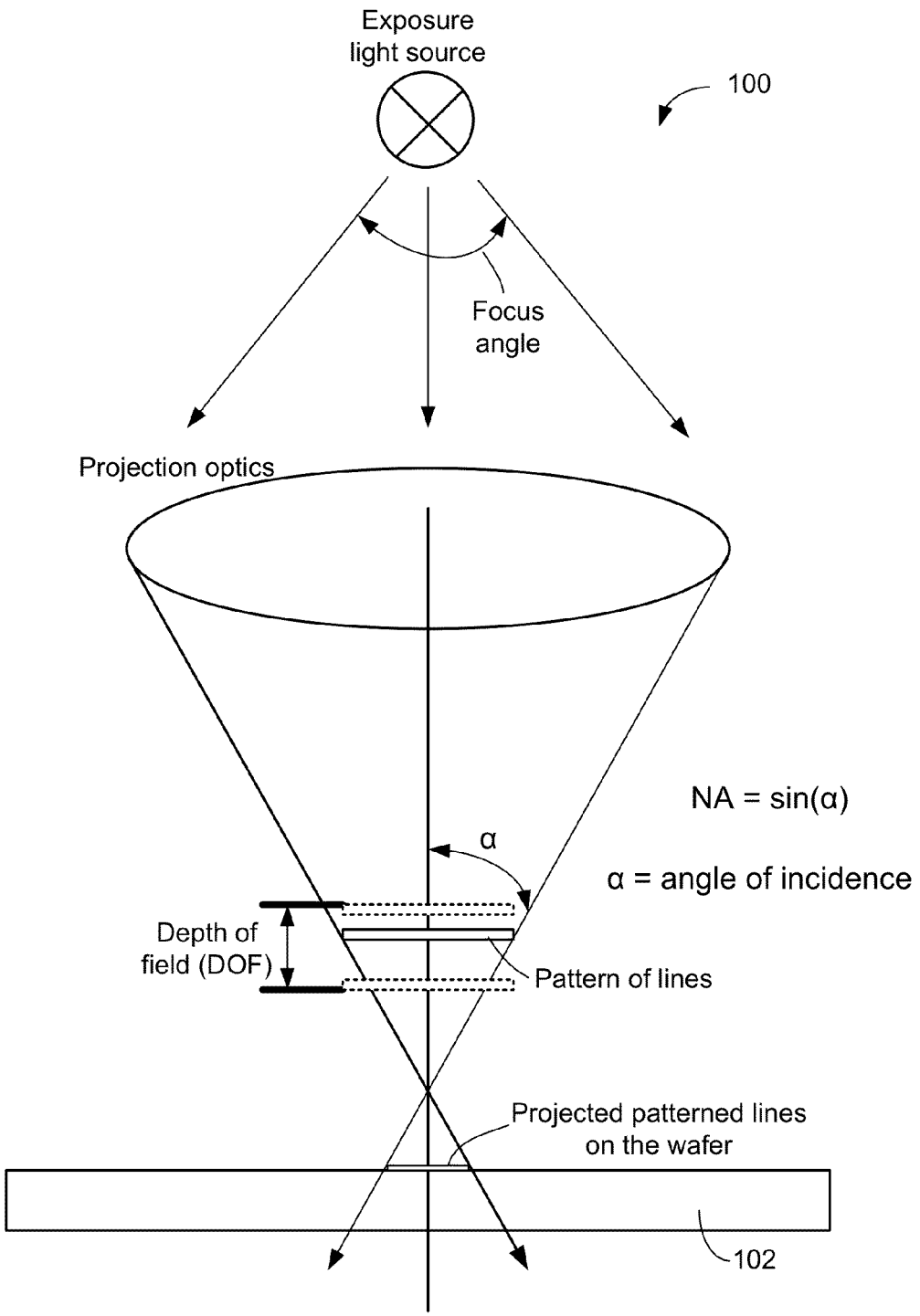
FIG. 1 is a simplified diagram illustrating operation of an exposure system.

FIG. 1 is a simplified diagram illustrating operation of an exposure system. As shown in FIG. 1, an exposure system 100 projects a pattern on a wafer 102 through its projection optics by means of an exposure light source. For example, a predefined pattern of lines is projected onto the wafer. For the predefined pattern to have clear resolution on the wafer, it is crucial for the projection to be properly focused. When an image is projected from the exposure system to the wafer, the resolution of the projected image is defined by a depth of field (DOF). The depth of field is a range of depths within which the projected image retains an acceptable level of resolution. For example, a DOF is a measurement defined by a wavelength and a numerical aperture, and may be defined by the following equation.

$$DOF = \frac{K_2 * \lambda}{(NA)^2} \quad \text{(Equation 1)}$$

As shown in Equation 1, DOF is defined by a constant $K_2$, a wavelength of an exposure light $\lambda$, and the numerical aperture NA. As an example, $K_2$ is a constant that is used to define an acceptable value and/or range of DOF. A measurement related to DOF is resolution, which is also a function of a wavelength of an exposure light and a numerical aperture NA. Resolution may be defined by the following equation.

$$\text{Resolution} = \frac{K_1 * \lambda}{NA} \quad \text{(Equation 2)}$$

As shown in FIG. 1, the numerical aperture and DOF are related to the focus distance, or the distance between the projection optics and the wafer underneath. For example, if the to be projected image falls outside the DOF range, the projected image would appear out of focus (i.e., not having sufficient resolution).

To obtain proper resolution, it is often necessary to adjust the focus distance and/or other focusing parameters. With the advent of fabrication technologies, it is often imperative use the optimal focus distance. For example, in manufacturing integrated circuits with less than 180 nanometer channel length, the DOF for the photolithography process is less than 40 nanometers. As a result, any small shift and/or change could affect the resolution. Even minor positional change of the exposure machine could lead to production of invalid patterns.

In the past, calibration process is performed daily to determine the best focus parameters. In a conventional technique, a wafer material with a predefined layout is used for determining the optimal distance. For example, a sample wafer is divided into a number of regions. During the calibration process, a subject exposure machine produces a pattern for each of the regions. For example, each of the regions is associated with a focus parameter, such as focus distance or focus angle. A focus angle depends from the distance of the exposure light source to a target. As shown in FIG. 1, the focus angle may depend on the physical size of the target. In an embodiment, the target is the projection optics. In another embodiment, the target is a mask portion including pattern of lines. In yet another embodiment, the target is the wafer. The focus angle is inverse proportional to the distance. In other words, the close the target is to the light source, the larger the focus angle (or the farther the light source is from the target, the smaller the focus angle). After the patterns are formed on the wafer, the wafer is processed. After processing, various measurements are taken for each pattern formed on the wafer. For example, a scanning electron microscope (SEM) is employed for measuring the resolution of each pattern. Based on the measured resolution, a pattern with the highest resolution is selected. As an example, the selected pattern is associated with a particular focus parameter as specified by the particular location of the selected pattern on the wafer region.

The conventional calibration process for exposure machines as described above is widely used and is typically effective in determining certain focus parameters, such as focus angle, focus distance, etc. Unfortunately, this process is usually time-consuming. Often, the process of measuring pattern resolution on a wafer material takes two or more hours. During the calibration process, the exposure machine is typically idled, waiting for the calibration process to be complete. In addition to causing idle time, the conventional calibration process as described is often expensive, as measurements need to be performed by an SEM.

Therefore, it is to be appreciated that various embodiments of the present invention provide an improved method and system for calibrating exposure machines.

Figure 2:
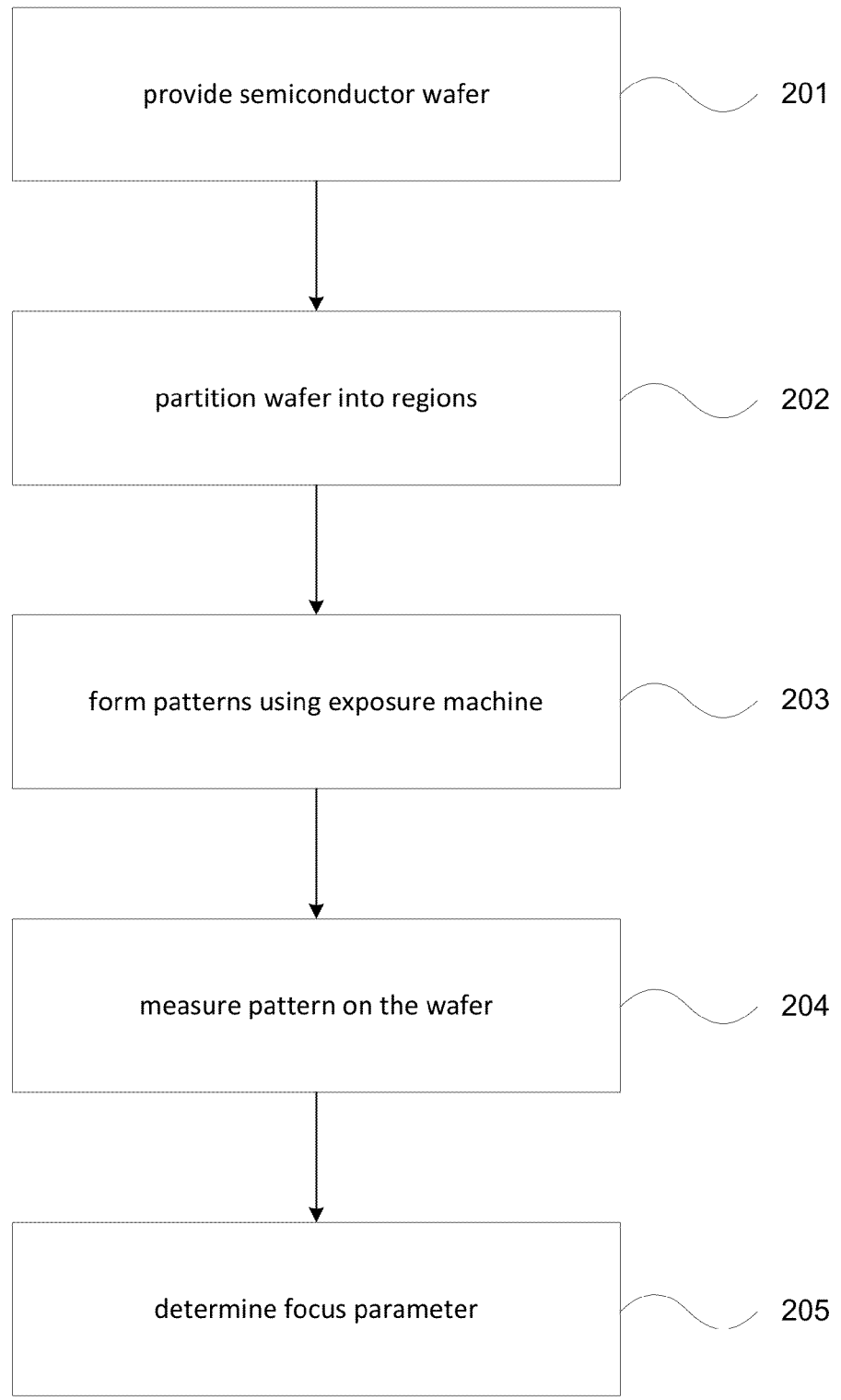
FIG. 2 is a simplified diagram illustrating a method for calibrating an exposure machine according to an embodiment of the present invention.

FIG. 2 is a simplified diagram illustrating a method for calibrating an exposure machine according to an embodiment of the present invention. This diagram is merely an example, which should not unduly limit the scope of the claims. One of ordinary skill in the art would recognize many variations, alternatives, and modifications.

At step 201, a semiconductor wafer is provided. Depending upon application, the wafer may be in various sizes, such as eight inches or twelve inches. As an example, the wafer includes pure silicon and is the same type of wafer that is used for manufacturing of integrated circuits.

At step 202, the semiconductor wafer is partitioned into regions. According to an embodiment, the wafer is divided into a plurality of regions by a grid, and each region is used for a pattern. It is to be understood that physical partitioning is not required, as partitioned regions on the wafer are used to facilitate calibration process of the exposure machine.

Figure 3:
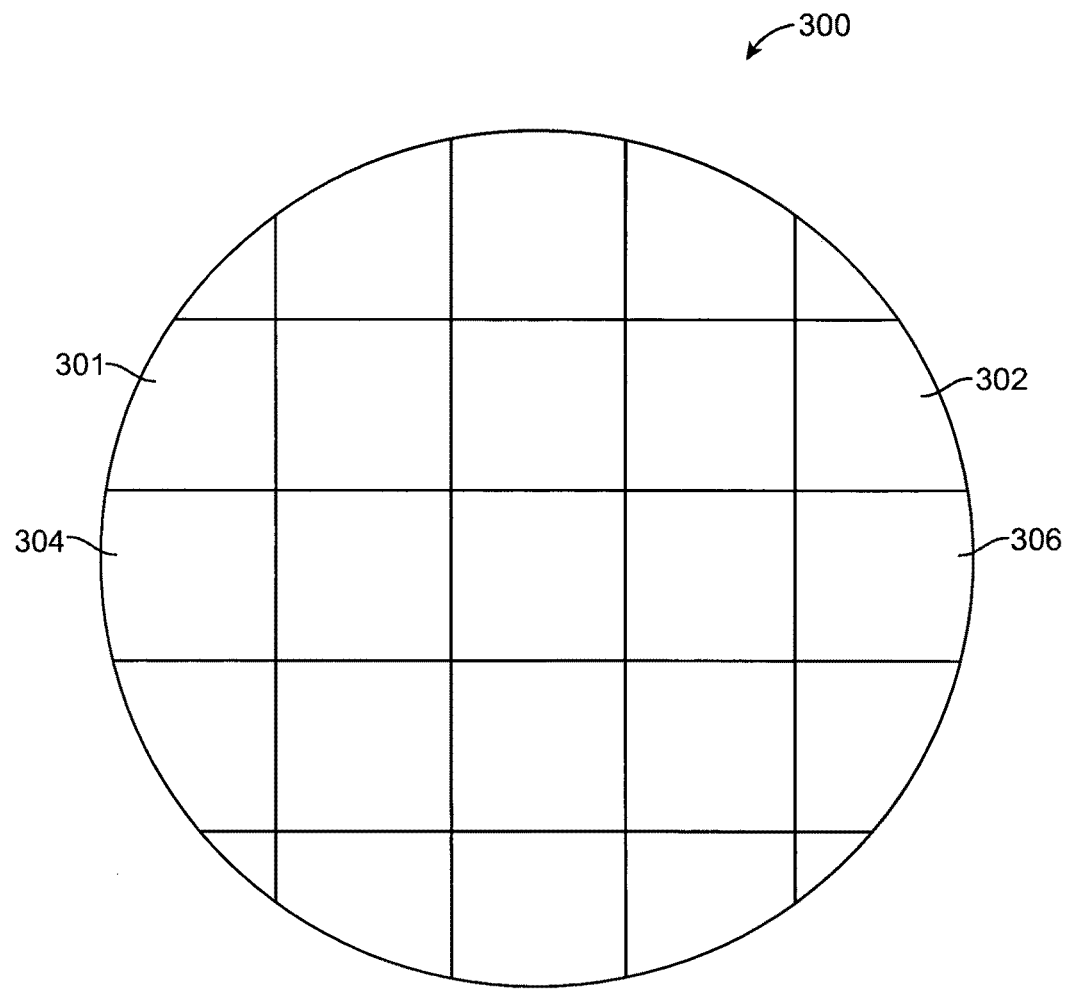
FIG. 3 is a simplified diagram illustrating a partitioned semiconductor wafer according to an embodiment of the present invention.

FIG. 3 is a simplified diagram illustrating a partitioned semiconductor wafer according to an embodiment of the present invention. This diagram is merely an example, which should not unduly limit the scope of the claims. One of ordinary skill in the art would recognize many variations, alternatives, and modifications. As shown in FIG. 3, the wafer 300 is partitioned into regions. As an example, a region 301 is to include a pattern that is formed with a focusing distance adjustment of 40 nanometers while a region 302 is to include a pattern that is formed with a focusing distance adjustment of 60 nanometers.

Now referring back to FIG. 2.

At step 203, patterns are formed on the wafer using the exposure machine. At each of the partitioned regions, a pattern is defined using the exposure machine with a predefined focus parameter. For example, in a row of partitioned regions on the wafer, patterns are formed with the exposure machine focusing at different distances.

Figure 4:
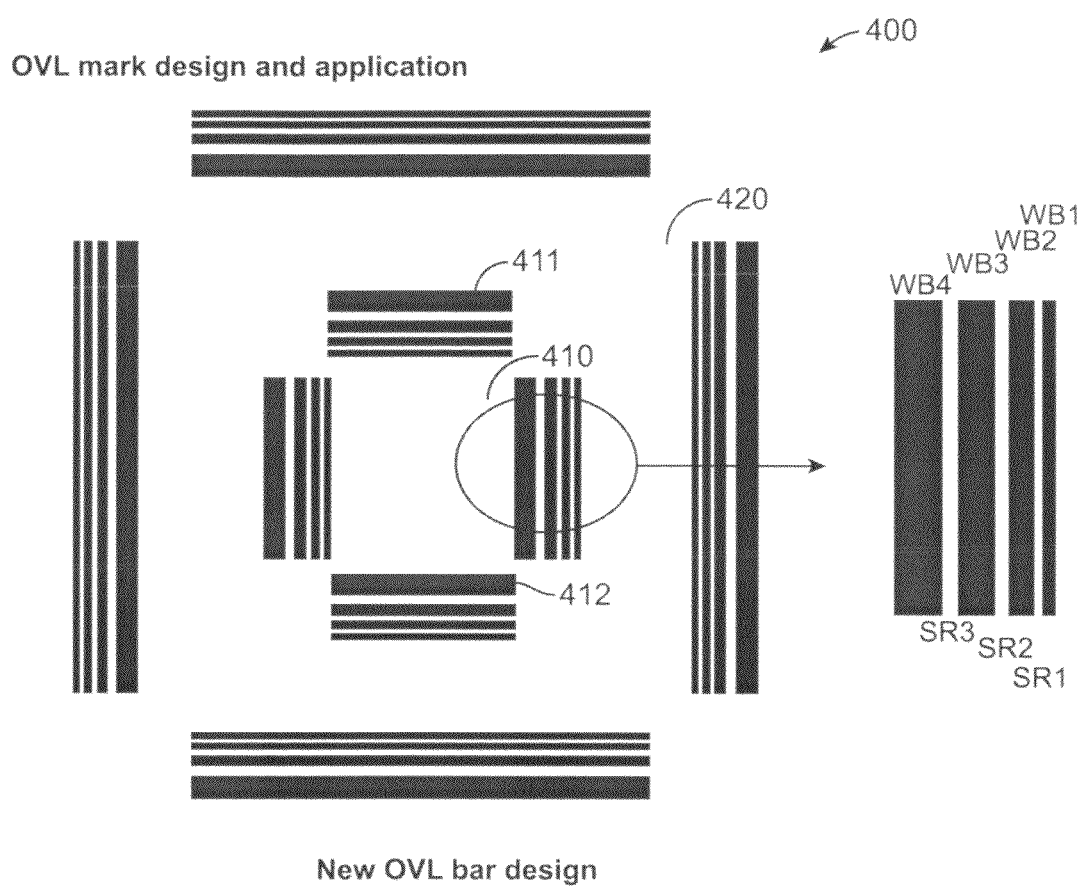
FIG. 4 is a simplified diagram illustrating a mask pattern according to an embodiment of the present invention.

FIG. 4 is a simplified diagram illustrating a mask pattern according to an embodiment of the present invention. This diagram is merely an example, which should not unduly limit the scope of the claims. One of ordinary skill in the art would recognize many variations, alternatives, and modifications. As shown in FIG. 4, a pattern 400 includes a first group of lines that enclose a first square 410 and a second group of lines that encloses the first group of lines. As used in various embodiments of the present invention, the pattern 400 has predetermined dimensions. For example, bars 411 and 412 are separated by a predetermined distance.

As seen in FIG. 4, each pattern includes lines of different width. According to certain embodiments, lines of different width are used for different type of applications. For example, different width corresponds to different resolution requirement as shown below in Table 1.

TABLE 1

| Item | Pattern definition | DOF range (um) | Size example (um) |
|------|-------------------|----------------|-------------------|
| WB1 | PR resolution limit and minimum DOF | 0.1-0.2 | 0.11 |
| WB2 | Critical photo process like poly layer | 0.3-0.4 | 0.15 |
| WB3 | Non-critical photo layer process window | 0.5-0.8 | 0.18 |
| WB4 | Offer stable signal for overlay measurement | X | 1.5 |
| SR1 | PR resolution limit and minimum DOF | 0.3-0.4 | 0.11 |
| SR2 | Normal PR resolution | >0.8 | 0.15 |
| SR3 | Normal PR resolution | >0.8 | 0.18 |

Now referring back to FIG. 2. At step 204, each of patterns on the wafer material is measured. Depending upon applications, patterns may be measured by different types of tools, such as optical scanner, and the like. According to an embodiment, the distance between two predetermined lines of a same pattern is measured. According to another embodiment, the center position between two predetermined lines of a same pattern are measured. For example, measurement is performed for each of the patterns on the wafer.

Figure 5:
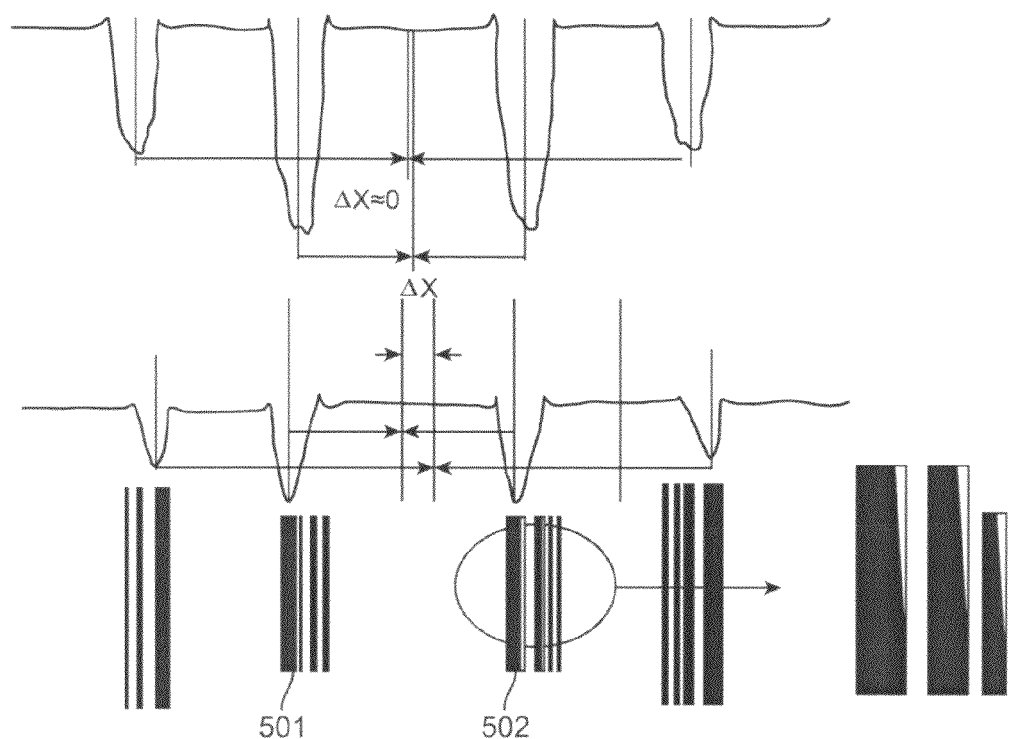
FIG. 5 is a simplified diagram illustrating a technique for measuring patterns on a wafer according to an embodiment of the present invention.

FIG. 5 is a simplified diagram illustrating a technique for measuring patterns on a wafer according to an embodiment of the present invention. This diagram is merely an example, which should not unduly limit the scope of the claims. One of ordinary skill in the art would recognize many variations, alternatives, and modifications. As shown in FIG. 5, a center position between two lines is measured and an offset of the measured center positioned from a predefined center position (i.e., as indicated by delta x) is determined. In the past, center positions and shifts thereof have been used for calibrating overlay positions of patterns. It is to be appreciated that various embodiments of the present invention uses center positions and shift positions to determine proper focus parameters. As an example, proper focus of the exposure reduces the amount of shift of center positions, as the patterns are better defined. As shown in FIG. 5, a line 502 is not perfectly in focus, which consequently causes a shift of center position.

Now referring back to FIG. 2. At step 205, one or more focus parameters are determined based on the measurement performed at step 204. Depending upon application, focus parameters may be determined in various ways.

In a specific embodiment, a pattern with the highest resolution (i.e., smallest shift from center) on the wafer is selected. As explained above, each pattern on the wafer is associated with one or more focus parameters. For example, focus parameter that is associated with the selected pattern are determined to be the optimal focus parameter.

According to various embodiments, one or more focus parameters are determined based on measured values of patterns with approximation and/or interpolation methods. For example, focus distance values are plotted against shift position values, as shown in Table 2 below.

TABLE 2

| | Focus (um) | | | | | | | | |
|---|---|---|---|---|---|---|---|---|---|
| | −0.8 | −0.6 | −0.4 | −0.2 | 0 | 0.2 | 0.4 | 0.6 | 0.8 |
| ΔX(nm) | 86 | 55 | 25 | 15 | 3 | 13 | 20 | 45 | 80 |

Figure 6:
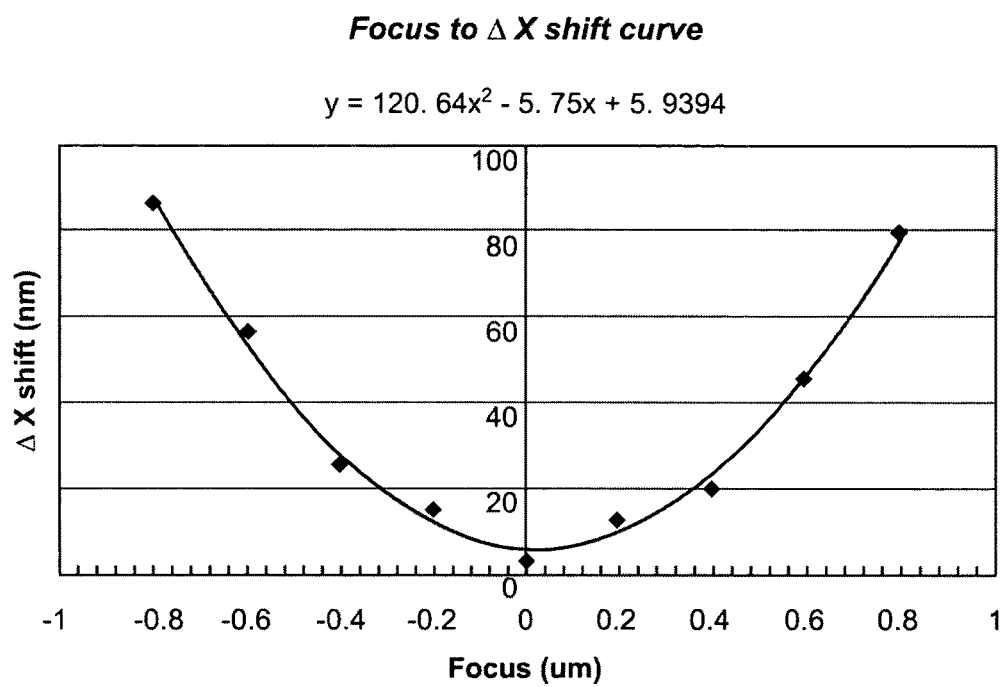
FIG. 6 is a simplified diagram illustrating a graph used for determining an optical focus distance according to an embodiment of the present invention.

As an example, values in Table 2 are plotted into a graph and then interpolated. FIG. 6 is a simplified diagram illustrating a graph used for determining an optical focus distance according to an embodiment of the present invention. This diagram is merely an example, which should not unduly limit the scope of the claims. One of ordinary skill in the art would recognize many variations, alternatives, and modifications. As seen in FIG. 6, focus position is represent by the horizontal axis while shift position is represent by the vertical axis. As an example, data points as seen in FIG. 6 are best approximate by a curve. For example, the optimal focus distance determining as which focus distance would yield the minimum center shift. Using FIG. 6 as an example, the shift position curve may be represented by the following equation.

$$y = 120.64x^2 - 5.75x + 5.9394 \quad \text{(Equation 3)}$$

In Equation 3, the value of y represents the amount of shift position. The optimal focus distance may simply be the value of x, which represents focus position, that would yield the minimum value of y. In this particular example, the x value of minimum y value is 0.024 micrometers.

According to an embodiment, the present invention provides a method for determining one or more focus parameters for an exposure system. As an example, the exposure system is used for forming patterns on a semiconductor wafer. The method includes a step for providing a semiconductor wafer. The semiconductor wafer is characterized by a diameter. The method also includes a step for forming a plurality of patterns using the exposure system on the semiconductor wafer. As an example, each of the plurality of patterns is associated with a focus reference value (e.g., focus distance, focus angle, etc.). The method additionally includes a step for determining a plurality of shift profiles, and each of the shift profile is associated with one of the plurality of patterns. The method further includes a step for selecting a first pattern from the plurality of patterns based on the plurality of shift profiles. Also, the method includes a step for determining a focus parameter for the exposure system based on the first pattern. For example, the embodiment is illustrated according to FIG. 2.

According to another embodiment, the present invention provides a method for determining one or more focus parameters for an exposure system, which is used for forming patterns on semiconductor patterns. The method includes a step for providing a semiconductor wafer that is characterized by a diameter. The method also includes a step for defining a plurality of regions on the semiconductor wafer. As an example, each of the plurality of regions is associated with a predefined focus parameter. The method also includes a step for forming a plurality of patterns using the exposure system on the semiconductor wafer. For example, each of the plurality of patterns is positioned within one of the plurality of regions. The method further includes a step for determining a plurality of pattern positions, and each of the pattern positions is associated with one of the plurality of patterns. Also, the method includes a step for determining one or more focus parameters for the exposure system based on the plurality of pattern positions. For example, the embodiment is illustrated according to FIG. 2.

According to yet another embodiment, the present invention provides a method for determining one or more focus parameters for an exposure system. As an example, the exposure system is used in photolithographic processes in manufacturing integrated circuits. The method includes a step for providing a semiconductor wafer, which is characterized by a diameter. The method also includes a step for forming a plurality of patterns using the exposure system on the semiconductor wafer, and each of the plurality of patterns is associated with one or more known focus parameters. The method additionally includes a step for obtaining characteristics for each of the plurality of patterns using an optical measuring device. Among other things, the characteristics include measured center positions. The method also includes a step for determining one or more focus parameters for the exposure system based on the characteristics. For example, the embodiment is illustrated according to FIG. 2.

It is to be appreciated that embodiments of the present invention provides various advantages over conventional techniques. Among other things, certain embodiments of the present invention greatly reduce the amount of time necessary for calibrating an exposure system. For example, conventional calibration techniques often take hours to complete. In contrasts, various embodiments of the present invention reliability completes calibration of an exposure system in minutes, thereby reducing the amount of down time that is necessary for most calibration techniques. Additionally, the present invention provides a process that is compatible with conventional process technology without substantial modifications to conventional equipment and processes. Depending upon the embodiment, one or more of these benefits may be achieved.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for determining one or more focus parameters for an exposure system, the exposure system being used in photolithographic processes in manufacturing integrated circuits, the method comprising:

forming a first plurality of patterns and a second plurality of patterns using the exposure system on a semiconductor wafer, each of the plurality of patterns being associated with one or more known focus parameters, wherein the first plurality of patterns is configured such that a focused portion thereof is shifted in a first direction when the exposure system is out of focus, and the second plurality of patterns is configured such that a focused portion thereof is shifted in a second direction opposite the first direction when the exposure system is out of focus;

obtaining characteristics for each of the first plurality and the second plurality of patterns using an optical measuring device; and determining a focus position for the exposure system associated with a minimal relative shift, wherein forming the first plurality of patterns includes forming the following plurality of lines and spaces in an order along a first direction:

a first line having a width that is at a photoresist resolution line width limit;

a first space having a width that is at a photoresist resolution spacing limit;

a second line having a width that is at a line width for a critical photo step;

a second space having a width that is at a normal photoresist spacing resolution;

a third line having a width that is at a line width for a non-critical photo step;

a third space having a width that is at a normal photoresist spacing resolution; and a fourth line having a width that is at a line width for a stable overlay measurement;

wherein forming the second plurality of patterns includes forming said plurality of lines and spaces in an opposite order along the first direction.

2. The method of claim 1, wherein each of the first plurality of patterns comprises segments arranged in a spatial direction in decreasing depth of focus, and each of the second plurality of patterns comprises segments arranged said spatial direction in increasing depth of focus.

3. The method of claim 1, wherein each of the first plurality of patterns and the second plurality of patterns comprises segments having different line widths and spacings.

4. The method of claim 3, wherein each of the first plurality of patterns comprises segments arranged in a spatial direction in decreasing line width and resolution, and each of the second plurality of patterns comprises segments arranged said spatial direction in increasing line width and resolution.

5. The method of claim 1, further comprising determining a relative shift between focus portions of the first and the second plurality of patterns by:

determining a center position of focused portions of the first plurality of patterns;

determining a center position of focused portions of the second plurality of patterns; and determining a distance between the two center positions.

* * * * *